United States Patent [19]
Leclerc et al.

[11] Patent Number: 6,160,927
[45] Date of Patent: Dec. 12, 2000

[54] METHOD OF FABRICATING INTEGRATED OPTICAL CIRCUITS WHICH MINIMIZES OPTICAL COUPLING LOSSES

[75] Inventors: Denis Leclerc, Igny; Roland Mestric, Paris, both of France

[73] Assignee: Alcatel, Paris, France

[21] Appl. No.: 09/037,761

[22] Filed: Mar. 10, 1998

[30] Foreign Application Priority Data

Mar. 13, 1997 [FR] France .................................. 97 02993

[51] Int. Cl.$^7$ .................................................. G02B 6/122
[52] U.S. Cl. .............................. 385/14; 385/43; 385/129
[58] Field of Search .................................. 385/14, 39, 43, 385/49–51, 129–131

[56] References Cited

U.S. PATENT DOCUMENTS

| | | | |
|---|---|---|---|
| 4,666,236 | 5/1987 | Mikami et al. | 385/51 |
| 5,402,511 | 3/1995 | Malone et al. | 385/43 |
| 5,515,464 | 5/1996 | Sheem | 385/49 |
| 5,623,568 | 4/1997 | Khan et al. | 385/14 X |
| 5,687,272 | 11/1997 | Vinchant et al. | 385/131 |
| 5,757,995 | 5/1998 | Chen et al. | 385/50 X |
| 5,854,868 | 12/1998 | Yoshimura et al. | 385/50 |
| 5,985,685 | 11/1999 | Lealman et al. | 385/49 X |

FOREIGN PATENT DOCUMENTS

| | | |
|---|---|---|
| 0642041A1 | 3/1995 | European Pat. Off. . |
| 0665450A1 | 8/1995 | European Pat. Off. . |
| WO9609668 | 3/1996 | WIPO . |

*Primary Examiner*—John D. Lee
*Attorney, Agent, or Firm*—Sughrue, Mion, Zinn, Macpeak & Seas, PLLC

[57] ABSTRACT

A process is provided for fabricating an integrated optical circuit comprising waveguides having different structures. In this process the coupled ends of the different structures are designed to enlarge the lateral mode size of optical waves issuing from them. The optical coupling losses of the integrated optical circuit obtained in this way are considerably reduced.

7 Claims, 7 Drawing Sheets

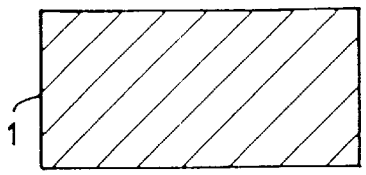
FIG_1A PRIOR ART
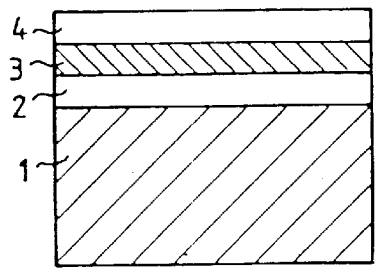
FIG_1B PRIOR ART
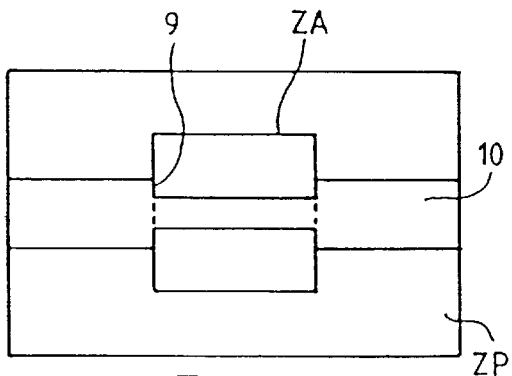
FIG_2 PRIOR ART
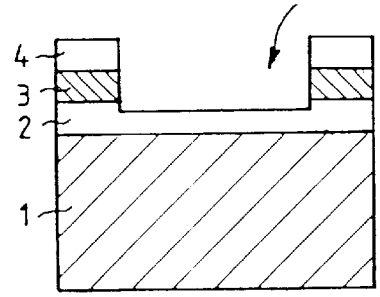
PRIOR ART FIG_1C
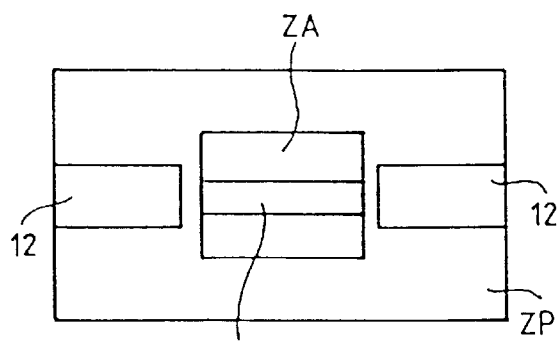
FIG_3 PRIOR ART
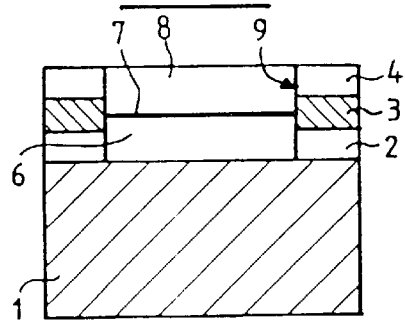
FIG_1D PRIOR ART

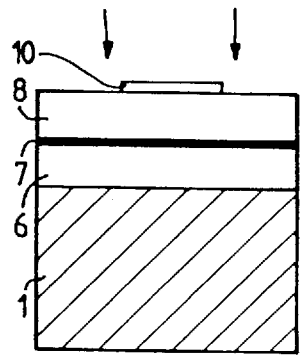
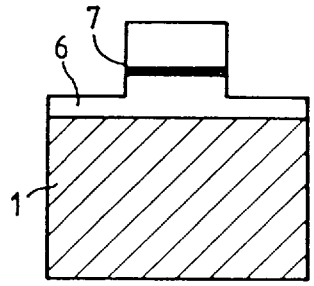
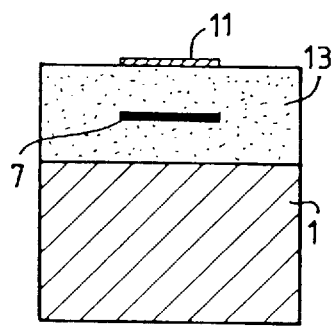
FIG_4A
PRIOR ART
FIG_4B
PRIOR ART
FIG_4C
PRIOR ART
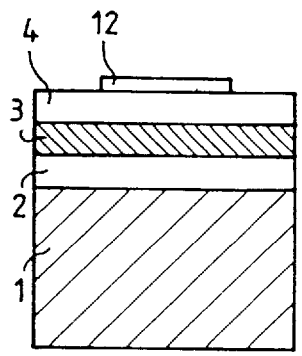
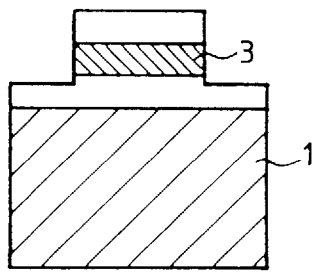
FIG_4D
PRIOR ART
FIG_4E
PRIOR ART
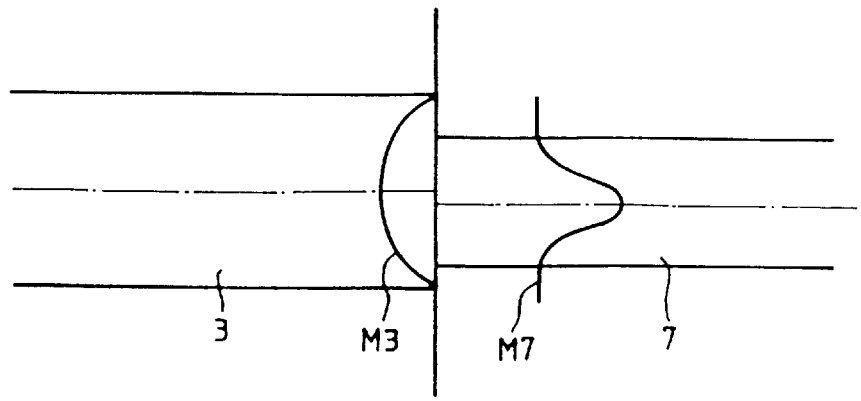
FIG_5
PRIOR ART

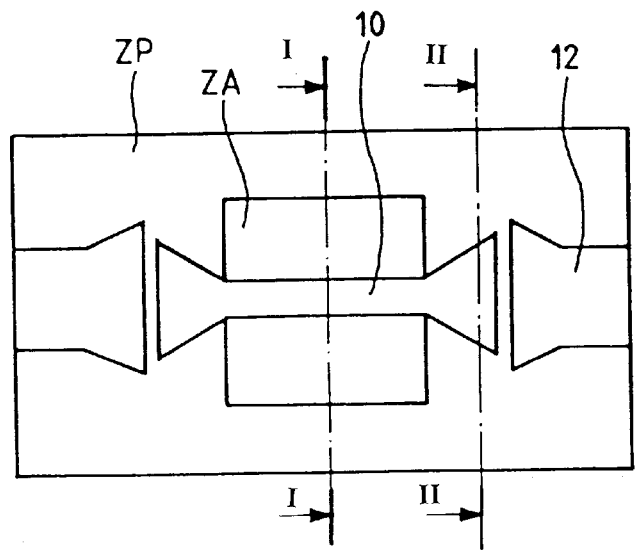
FIG_6A
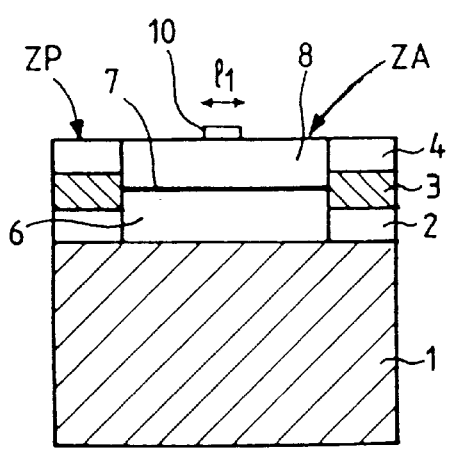
FIG_6B
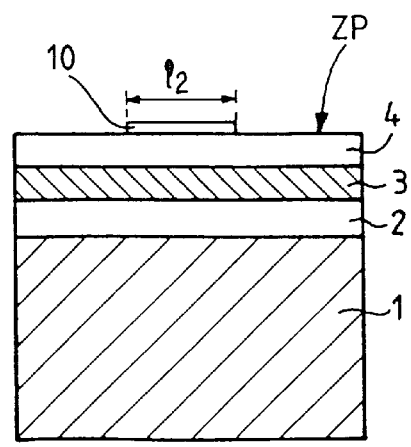
FIG_6C

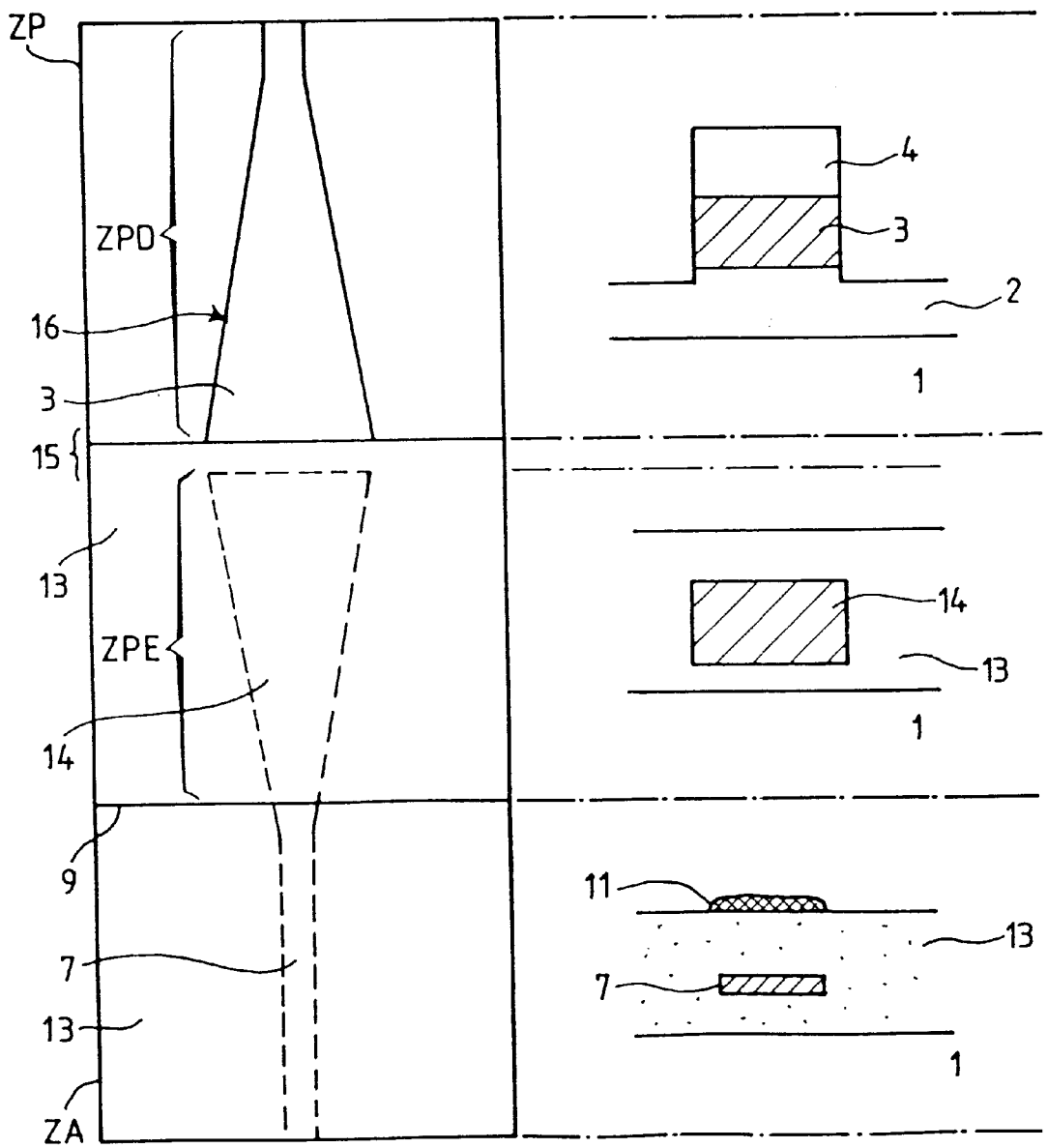
FIG_7A    FIG_7B

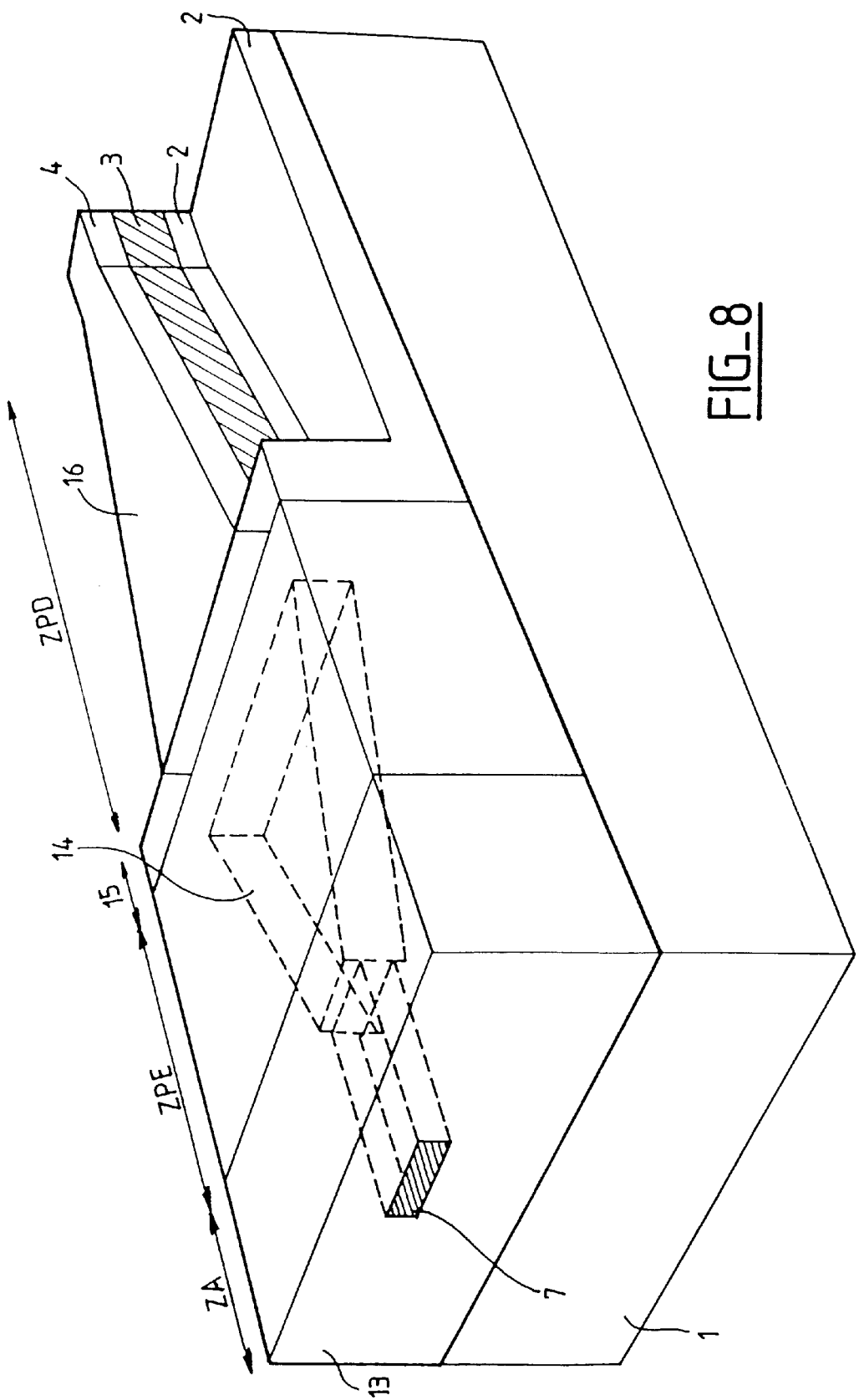
FIG_8

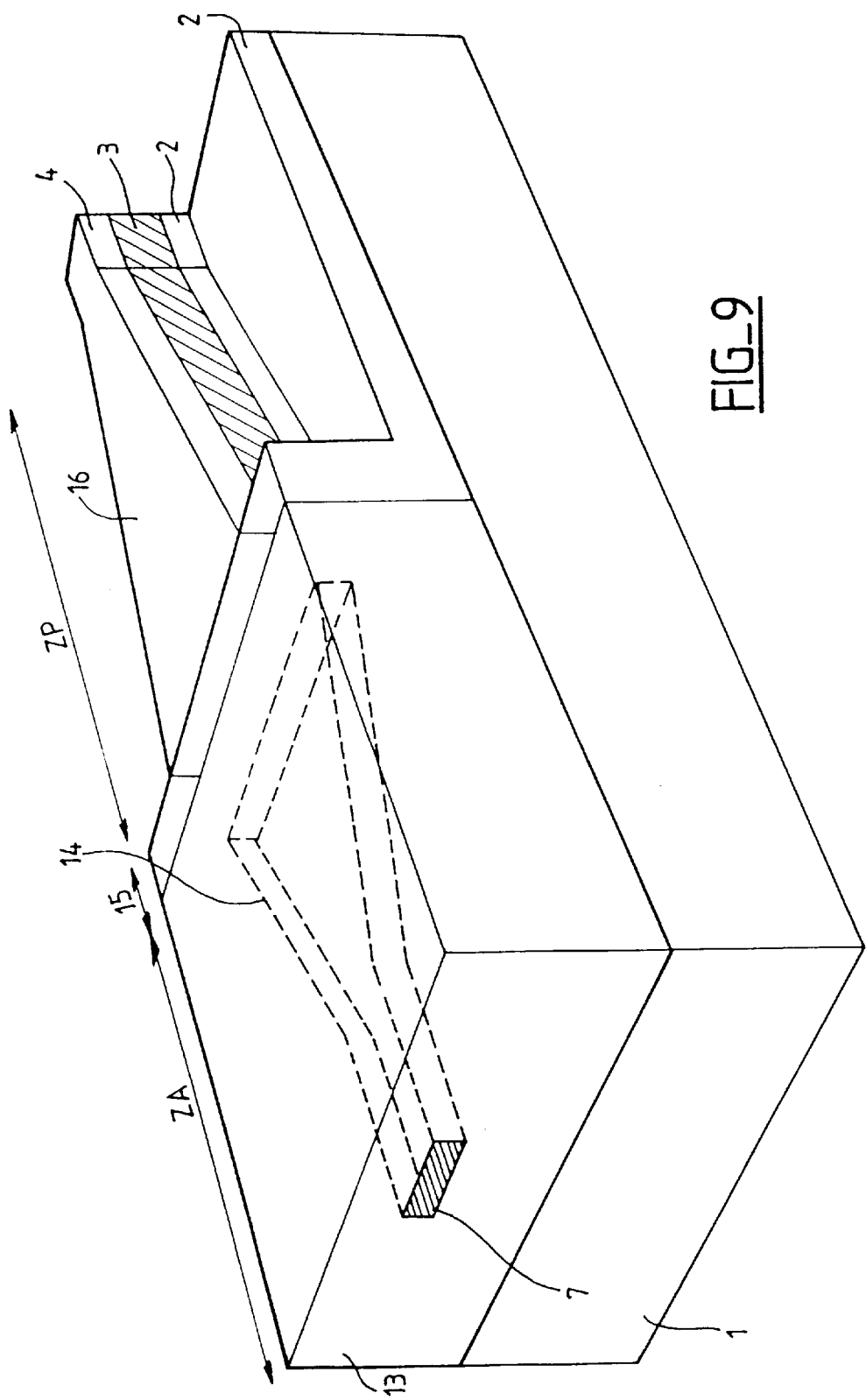
FIG_9

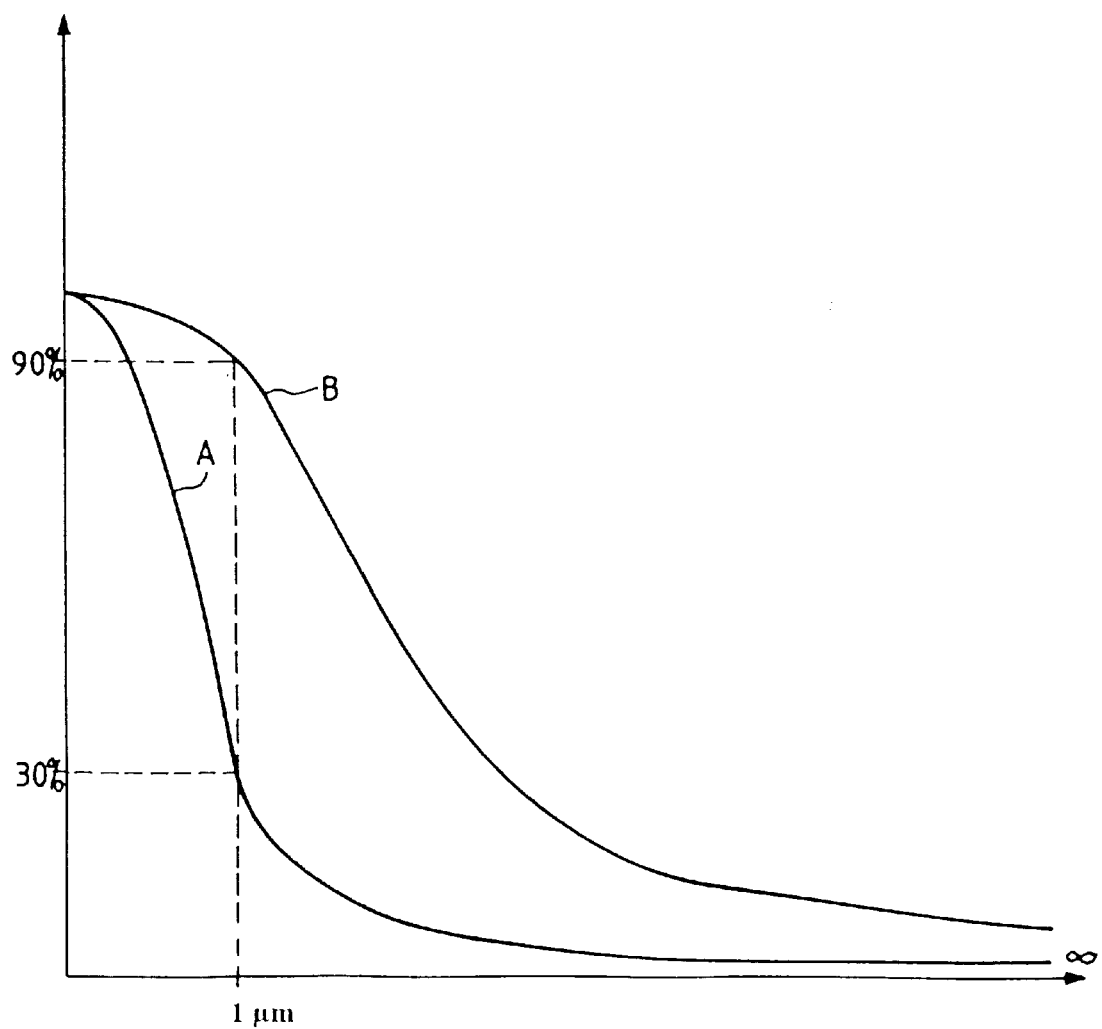
FIG_10

METHOD OF FABRICATING INTEGRATED OPTICAL CIRCUITS WHICH MINIMIZES OPTICAL COUPLING LOSSES

BACKGROUND OF THE INVENTION

1. Field of the invention

The present invention concerns a method of fabricating integrated optical circuits including waveguides having different structures, in particular different vertical and lateral structures. The method improves the coupling between the guides and consequently minimizes optical losses.

2. Description of the prior art

Integrated optical circuits are designed to combine a plurality of optical components having different functions and structures. Such circuits are made in two stages. In a first stage the various active and/or passive components are integrated on a substrate using a method known as butt coupling. In a second stage the waveguides of the various components are etched in the form of strips to assure lateral confinement of the light.

The butt coupling method of integrating optical components is very widely used at present. The schematics of FIGS. 1A through 1D represent views in longitudinal section of an integrated optical circuit during various steps of the butt coupling method.

This method consists, in a first step, of growing onto a substrate 1 various layers 2, 3, 4 intended to form a passive structure, for example. The stack of layers comprises a first layer 2 of indium phosphide (InP), a second layer 3 of quaternary material to serve as a waveguide and finally a third layer 4 of InP, for example.

At least one cavity 5 is then etched into this stack of layers using a conventional and optimized process. The cavity 5 is reserved for the integration of another type of optical component, such as a semiconductor laser, for example.

The active component is formed by growing a plurality of layers 6, 7 and 8 epitaxially. The layer 7 constitutes the waveguide and is formed of a quaternary material, for example, whereas the other layers 6 and 8 are formed of InP, for example. The structure of the waveguide 7 is different from that of the passive guide 3. The interface 9 between the two types of component is known as a butt joint.

At this stage in the fabrication of integrated optical circuits the various optical guides must be etched in the form of strips to assure lateral confinement of the light. Over the last five years many attempts have been made to etch the waveguides using a so-called self-aligning method.

This method consists in defining the lateral structures of the guides in a single step using a single mask 10 as shown by the schematic top view of a circuit shown in FIG. 2. The region ZA corresponds to the active area and the region ZP corresponds to the passive area.

However, the self-aligning method requires a compromise with regard to the process for producing the waveguide strips. This compromise is not without consequences in terms of the performance of the final device.

In the conventional process the various active and passive optical components are fabricated separately and the structures of the waveguides are defined by completely different and optimized technologies. When two different structures are placed end to end and their waveguides are etched by means of a single mask 10 only one technology is generally used, rather than two.

The composition of the mask 10 used in the self-aligning process is generally different from that of the masks used in conventional processes for fabricating each of the optical components separately. Its composition can preferably be metallic rather than of resin or of silica. This difference in composition leads to a modification in the etching technology employed to define the structures of the waveguides. Accordingly, the self-aligning method requires a compromise with regard to the etching technology for defining all the waveguide structures simultaneously.

The attempts made until now to obtain a satisfactory compromise have not been successful and in no single instance indicate that mass production of integrated optical circuits is feasible.

A first problem to be solved therefore consists in finding another solution for producing integrated optical circuits using the fabrication technologies routinely employed and optimized for each of the components constituting such circuits.

We have envisaged integrating the various optical components by the butt coupling method and then defining the lateral structures of the waveguides by a realignment method. The realignment method more precisely consists in defining the waveguides having different structures using a plurality of masks, possibly of different composition, enabling the use of the technologies routinely employed and optimized for each type of structure.

FIG. 3 is a schematic top view of an integrated optical circuit having an active area ZA and a passive area ZP on which are disposed masks 10 and 12 of two types respectively used to produce an active waveguide strip and to produce two passive waveguide strips.

The realignment method consists in protecting a portion of the active area ZA and all of the passive area ZP by means of a mask 10 and then etching the optical guide of the active structure using the appropriate and optimized etching technology routinely employed. In a second step a portion of the passive area ZP is protected by means of one or more other masks 12 and all of the active area ZA is protected with resin, for example, after which the optical guide of the passive structure is etched using the appropriate and optimized etching technology routinely employed.

The example shown schematically in FIGS. 4A through 4E explains how the various waveguides are defined. In a first step an active structure and two passive structures on respective opposite sites of the active structure are integrated onto a substrate 1 using the butt coupling method as previously explained with reference to FIGS. 1A through 1D. The schematics of FIGS. 4A through 4C correspond to a view of the integrated circuit in cross-section through the active structure. The schematics of FIGS. 4D and 4E correspond to a view of the integrated circuit in cross-section through the passive structure.

The realignment method consists in, in a first step, protecting all of the passive area and a portion of the active structure by means of a mask 10 and then etching the layers 6, 7, 8 on respective opposite sides of the mask 10. The active layer strip obtained in this way is then buried in a cladding layer 13, as shown in FIG. 4B.

Proton implantation in the cladding layer 13 then increases the resistivity of the material and consequently improves the confinement of the current in the active layer. An electrode is formed by depositing metallization 11 on top of the active layer ribbon 7 to enable current to be injected into the active structure.

In a second step a mask 12 is placed on top of the passive structure in order to etch the passive guides (FIG. 4D).

Resin is first applied to the combination of active and passive structures in order to protect the active structure and to enable the masks 12 to be placed on the passive structure. The masks 12 comprise a quartz plate, for example, on which are drawn imprints corresponding to the passive guides to be obtained. The masks 12 are placed on the integrated circuit and their position is then adjusted to align the drawn imprints with the waveguide of the active component. This adjustment is imprecise because it is done by eye. When the masks 12 have been adjusted the resin is exposed and the imprint of the guides is transferred to the resin. The passive guide strips are then etched in accordance with the shape of the imprint after which the resin is removed using a solvent. Unlike the active layer strip 7, the passive structure waveguides 3 are not buried.

The realignment procedure just described is conventional and well known to the skilled person.

The realignment method is highly advantageous as it is consistent with the standard processes that have been optimized and adapted to the fabrication of each type of structure. However, it introduces great difficulties concerning the alignment of the various waveguides. It is very difficult to position correctly the masks that define the various guides since this positioning can only be done via a microscope, that is to say by eye. Aligning two waveguides with different structures to an error of less than 1 $\mu$m ($10^{-6}$ m) is very difficult.

FIG. 5 is a schematic top view of two guides with different structures aligned by the realignment method. The guide 3 is a passive structure guide, for example, and the guide 7 is an active structure guide. The two waveguides 7 and 3 are slightly misaligned but sufficiently so to generate high optical coupling losses due to poor overlapping of the optical modes M3, M7 of the waves issuing from the guides.

The present invention solves this second problem and proposes a process for fabricating integrated optical circuits in which optical coupling losses are very significantly reduced.

SUMMARY OF THE INVENTION

The invention consists in a process for fabricating integrated optical circuits comprising at least two waveguides having different structures, respective ends of the guides being coupled to each other, wherein the guides are defined and produced independently by means of specific masks such that said coupled ends are each adapted to enlarge the lateral mode size of optical waves leaving the ends.

In accordance with another feature of the invention the masks have enlarged ends corresponding to the coupled ends of the guides.

In accordance with another feature of the invention the ends are enlarged in the form of cones the generatrices of which are rectilinear or curved.

The invention also consists in an integrated optical circuit comprising at least two waveguides with different structures, respective ends of the guides being coupled to each other, wherein the coupled ends are separated from each other by an area with no lateral guidance and each end has a shape adapted to enlarge the lateral mode size of optical waves issuing from the ends.

In accordance with another feature of the invention the coupled ends are in the form of cones the generatrices of which are rectilinear or curved.

In accordance with another feature of the invention the integrated optical circuit includes an active area containing an active structure waveguide buried in a cladding area and a passive area divided into two parts, namely a first part buried in the cladding layer and containing the conical shape coupled end or ends of the active structure waveguide and a second part that is not buried and including a passive structure waveguide having its coupled end or ends of conical shape.

In accordance with another feature of the invention the integrated optical circuit includes an active area containing an active structure waveguide and its conical shape coupled end or ends buried in a cladding layer and a passive area that is not buried and includes a passive structure waveguide having its coupled end or ends of conical shape.

Other features and advantages of the invention will become apparent from a reading of the description given by way of illustrative and non-limiting example with reference to the appended drawings.

BRIEF DESCRIPTION OF THE DRAWINGS

FIGS. 1A through 1D, already described, are schematic views in longitudinal section of an integrated optical circuit during steps of fabrication by the butt coupling method.

FIG. 2, already described, is a schematic top view of an integrated optical circuit with a single mask used to define the various waveguides by the self-aligning method.

FIG. 3, already described, is a schematic top view of an integrated optical circuit with two types of mask used to define two waveguides with different structures by the realignment method.

FIGS. 4A through 4E a schematic views in cross-section of an integrated optical circuit during steps to define different waveguide structures by the realignment method.

FIG. 5, already described, is a schematic top view of two types of waveguide made and aligned by the realignment method.

FIG. 6A is a schematic top view of an integrated optical circuit in accordance with the invention with two types of mask used to define two waveguides with different structures.

FIG. 6B is a view of the circuit from FIG. 6A in cross-section taken along the line I—I.

FIG. 6C is a view of the circuit from FIG. 6A in cross-section taken along the line II—II.

FIG. 7A is a top view of two waveguides with different structures in an integrated optical circuit in accordance with the invention.

FIG. 7B is a view in cross-section of three different parts of the circuit from FIG. 7A.

FIG. 8 is a perspective view of the circuit from FIG. 7A.

FIG. 9 is a perspective view of a different embodiment of integrated optical circuit.

FIG. 10 is a graph showing the overlap of the optical modes of two waveguides with different structures as a function of the misalignment of the guides and of the lateral mode size of the waves issuing from the guides.

DETAILED DESCRIPTION OF THE PREFERRED EMBODIMENTS

FIGS. 6A, 6B and 6C respectively represent a top view of an integrated optical circuit in accordance with the invention with masks for defining the shape of two types of waveguide and views in cross-section taken along I—I and II—II of the mask 10 for defining the active guide. In this example the optical circuit includes a semiconductor laser type active component and two passive components on respective opposite sides of the active component.

Of course, the invention is not limited to this example and a multitude of integrated optical circuits comprising a plurality of types of active and/or passive components can be produced by the same process. Accordingly, the invention can also be applied to integrating two active components, such as a laser and a modulator, for example, each having a buried or other structure.

In the FIG. 6A schematic the region ZA corresponds to the active area and the region ZP corresponds to the passive area. Two types of mask 10 and 12 are respectively used to define the waveguide of the active component and the waveguide of the passive component.

The masks used to produce the waveguides are advantageously not of constant width. To be able to minimize the optical coupling losses, the ends of the various guides adapted to be coupled together are designed to enlarge the mode size of the optical waves leaving those ends.

To achieve this, the ends of the masks defining each optical guide, which correspond to coupled ends of the guides, are in the shape of cones. The generatrices of the cones can be rectilinear or slightly curved.

In the example represented in FIG. 6A the active component is coupled to a passive component at each end.

Consequently, the two ends of the mask 10 are in the shape of cones. Also, the mask 10 used to define the active waveguide extends on respective opposite sides of the active area ZA.

However, it is entirely possible, in a different embodiment, to use a mask having the same dimensions as the active area ZA. Moreover, if the active component is coupled to only one other component, only one end, corresponding to the coupled end, is in the shape of a cone and optionally extends into the passive area.

FIG. 6B is a schematic view in cross-section taken along I—I of the circuit from FIG. 6A fitted with the mask 10. In this area the circuit includes a stack of layers 6, 7, 8 corresponding to the active area ZA and a stack of layers 2, 3, 4 corresponding to the passive area ZP. The layer 7 represents the active layer and is made from a quaternary material, for example. The mask 10 then has a width 11 corresponding to the width that the waveguide 7 must have to assure good lateral confinement of the light.

FIG. 6C is a schematic view in cross-section taken along II—II of the circuit from FIG. 6A fitted with the mask 10. In this area the circuit includes a stack of layers 2, 3, 4 corresponding to the passive area ZP. The layer 3 represents a passive waveguide. The mask 10 has, in this region, a width 12 greater than the width 11 of the mask above the active area ZA. The width 12 increases continuously in the direction away from the active area. The conical end of the guide therefore enlarges the mode size of the optical wave leaving the active waveguide 7.

The process in accordance with the invention for defining the waveguides of the various active and passive components consists, in a first step, of protecting a portion of the active area ZA and a portion of the passive area ZP with the mask 10 with conical ends and then etching the layers 6, 7, 8 and 2, 3, 4 on respective opposite sides of the mask 10. The active guide with conical ends obtained in this way is then buried in a cladding layer.

In a second time period the active area is covered with a protection layer and the masks 12 with one conical end are placed on top of the passive structure to etch the passive guides.

Resin is applied beforehand to both the active and passive structures so as to protect the active structure and to enable the masks 12 to be placed on the passive structure. The masks 12 consist of a quartz plate on which are drawn imprints corresponding to the passive guides to be produced, for example. The masks 12 are placed on the integrated circuit and then adjusted in position to align the drawn imprints with the waveguide of the active component. When the masks 12 have been adjusted the resin is exposed and the imprint of the guides is transferred onto the resin. The passive guide strips are then etched in accordance with the shape of the imprint after which the resin is removed using a solvent. Unlike the active layer strip 7, the passive structure waveguides 3 are not buried.

FIGS. 7A and 7B respectively represent a top view of an integrated optical circuit in accordance with the invention and views in cross-section of three separate parts of that circuit. The top view in FIG. 7A shows the shape of each waveguide. The integrated optical circuit includes two areas ZA and ZP respectively corresponding to the active area and the passive area. In the FIG. 7A example the passive area ZP is in turn divided into two parts ZPE and ZPD described in more detail below.

The dashed lines in the active area ZA represent the trace of the waveguide 7 of the active component. This waveguide is etched in the form of a strip and buried in a cladding layer 13. It is 1.2 $\mu$m wide, for example. The waveguide 7 is also represented in the facing cross-sectional view of FIG. 7B. It is 0.4 $\mu$m thick, for example. The active layer 7 is preferably made from a quaternary material having a forbidden band that has a width near the operating wavelength of 1.55 $\mu$m, i.e. that is equal, in wavelength, to 1.5 $\mu$m. The cladding layer 13 is made from an InP material. This material is doped with p type carriers to improve the confinement of the light in the active area 7. The circuit is produced on the substrate 1. Metallization 11 is applied on top of the active layer strip 7 to provide an electrode for injecting current into the active structure.

The passage between the active area ZA and the passive area ZP is at the interface 9 known as the butt joint.

The passive area ZP advantageously includes two separate portions, of which one portion ZPE is buried in the cladding layer 13 and the other portion ZPD is not buried. The area ZPD that is not buried corresponds to the passive structure guide 3 and the area ZPE that is buried corresponds to the conical end of the active structure waveguide 7.

To achieve this the mask used to define the active layer strip 7 is extended beyond the active area ZA and therefore overlaps part of the passive area ZP. This passive area part ZPE is consequently etched and then buried in the same manner as the active layer 7, as previously explained with reference to FIGS. 6A through 6C.

The passive area part ZPE preferably corresponds to the conical end of the active guide. Consequently, the dashed lines represented in the area ZPE correspond to the trace of the conical end 14 of the optical guide 7 which is buried in a cladding layer.

This conical part enlarges the mode size of the optical wave issuing from the optical guide 7. It is 200 $\mu$m long, for example, with a maximum width of a few microns, for example 5 $\mu$m.

The facing FIG. 7B includes a schematic view of the area ZPE in cross-section. The waveguide 14 is 1 $\mu$m thick, for example. It is advantageously made from a quaternary material having a forbidden band whose width, in wavelength, is equal to 1.1 $\mu$m and which is buried in the InP cladding layer 13. In this part the cladding layer is not necessarily doped with p type carriers.

Because the second part ZPD of the passive area ZP is not buried the waveguide 3 is represented in full line. The width of this guide is slightly greater than that of the active structure guide 7. It is equal to 2.5 μm, for example. The end of the guide 3 coupled to that of the active guide 7 is advantageously also etched in the form of a cone 16 so as to enlarge the mode size of the wave issuing from this guide. The cone 16 can be 200 μm long, for example, and its maximum width is a few microns, for example up to 6 μm.

The facing FIG. 7B includes a schematic view in cross-section of the part ZPD. This area comprises a stack of layers 2, 3 and 4 grown epitaxially on a substrate 1. The passive guide 3 has the same thickness as in the buried passive area ZPE. The bottom layer 2 and top layer 4 are preferably made from indium phosphide and are also 1 μm thick.

The substrate 1 on which the circuit is made is 300 μm thick, for example.

In accordance with one particular aspect of the invention, the conical ends 14 and 16 of the two types of waveguide 3 and 7 are separated from each other by a certain distance. This separation 15 corresponds to an area that is not guided laterally and which can therefore be referred to as a planar guide area or neutral area. The optical wave is guided vertically in this area, however.

The presence of the area 15 is essentially due to the fabrication technology. During the fabrication process the various masks are not placed end to end but are intentionally moved apart in order to prevent overlapping of the etching of the various guides. Any such overlap would lead to very high deterioration in the optical functions of the guides, or even complete destruction.

In practise the length of the area 15 is the result of an imposed separation between the masks that define the two waveguides to be coupled and the value of this separation is made greater than the tolerance for the positioning of the masks for the processes employed. A value of approximately 4 μm to 5 μm is typically adopted. The width of the area 15 is made sufficient to assure the absence of lateral mode guidance in this area.

Note that this area would be a serious problem if the waveguides were not enlarged because the optical losses that it generates would be very high compared to the overlap of the optical modes of the various guides. In accordance with the invention, enlarging the guides minimizes the drawbacks of the area 15 by increasing the tolerance on the separation between the masks without increasing the optical losses.

Moreover, the fact that the area 15 with no lateral guidance is not coincident with the interface 9 between the active area ZA and the passive area ZP provides an improved transition between the two types of area ZA and ZP.

FIG. 8 represents a schematic perspective view of the circuit just described. The reference numbers that are the same as those used in FIG. 7A and 7B designate the same component parts.

In a different embodiment, it is additionally possible for the active structure guide 7 and its conical end 14 not to extend beyond the active area ZA. In this case the passive area ZP includes only one non-buried part and the interface, or butt joint, is coincident with the planar guide area.

This embodiment is shown in the perspective view of FIG. 9. The active guide 7 and its conical end 14 are formed in the active area ZA and are buried in a cladding layer 13. The passive guide 3 and its conical end 16 are formed in the passive area ZP and are not buried. The interface, or butt joint, between the active and passive areas ZA and ZP is then coincident with the area 15 with no lateral guidance.

FIG. 10 is a graph with curves A and B showing the overlap of the optical modes of two waveguides with different structures as a function of their misalignment, respectively for guides that are not enlarged and for guides that are enlarged, to 6 μm.

In the case of curve A, i.e. when the waveguides are not enlarged, a misalignment of 1 μm between the guides corresponds to optical coupling losses of 5 dB, i.e. an overlap of the optical modes of only 30%.

In contrast, if the guides are enlarged, to 6 μm (curve B), the optical coupling losses for a misalignment of 1 μm between the guides are very much lower, at around 0.5 dB, which corresponds to an overlap of the optical modes of 90%.

Consequently, enlarging the waveguides allows looser tolerances in respect of the alignment of the guides.

What is claimed is:

1. A process for fabricating integrated optical circuits comprising at least two waveguides having first and second different vertical structures, respectively, said first and second structures each having at least two layers of different compositions, respective ends of said waveguides being coupled to each other, wherein said integrated circuits are monolithic integrated circuits, said process comprising: defining positions and shapes of said waveguides, and producing said waveguides, independently by means of specific masks such that said coupled ends are each adapted to enlarge the lateral mode size of optical waves leaving said ends, and wherein said coupled ends are separated from each other by an area with no lateral guidance.

2. The fabrication process claimed in claim 1 wherein said masks have enlarged ends corresponding to said coupled ends of said guides.

3. The fabrication process claimed in claim 1 wherein said ends are enlarged in the form of cones with rectilinear or curved generatrices.

4. An integrated optical circuit comprising at least two waveguides having first and second different structures, respectively, said first and second structures each having at least two layers of different compositions, respective ends of said waveguides being coupled to each other, wherein said integrated circuit is a monolithic integrated circuit, said coupled ends are separated from each other by an area with no lateral guidance and each of said coupled ends has a shape adapted to enlarge the lateral mode size of optical waves issuing from said ends wherein positions and shapes of said at least two waveguides are defined independently by means of specific masks.

5. The integrated optical circuit claimed in claim 4, wherein said coupled ends have a conical shape with rectilinear or curved generatrices.

6. The integrated optical circuit as claimed in claim 5, including an active area containing an active structure waveguide, buried in a cladding area, and a passive area divided into two parts, namely a first part, buried in said cladding layer and containing one of said conical shape coupled ends of said active structure waveguide, and a second part that is not buried and that includes a passive structure waveguide having the coupled end thereof of conical shape.

7. The integrated optical circuit as claimed in claim 5, including an active area containing an active structure waveguide and the conical shape coupled end thereof buried in a cladding layer, and a passive area that is not buried and includes a passive structure waveguide having the coupled end thereof of conical shape.

* * * * *